(12) United States Patent
Lee et al.

(10) Patent No.: US 9,184,164 B2
(45) Date of Patent: *Nov. 10, 2015

(54) NONVOLATILE MEMORY DEVICES

(71) Applicant: Samsung Electronics Co., Ltd., Suwon-si, Gyeonggi-do (KR)

(72) Inventors: Chang-Hyun Lee, Suwon-si (KR); Jung-Dal Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 53 days.

This patent is subject to a terminal disclaimer.

(21) Appl. No.: 14/134,457

(22) Filed: Dec. 19, 2013

(65) Prior Publication Data

US 2014/0106518 A1    Apr. 17, 2014

Related U.S. Application Data

(60) Division of application No. 13/357,350, filed on Jan. 24, 2012, now Pat. No. 8,629,489, which is a continuation of application No. 12/984,630, filed on Jan. 5, 2011, now Pat. No. 8,125,015, which is a division of application No. 11/363,326, filed on Feb. 27, 2006, now Pat. No. 7,888,203.

(30) Foreign Application Priority Data

Apr. 4, 2005    (KR) .................. 10-2005-0028117

(51) Int. Cl.
*H01L 21/336*    (2006.01)
*H01L 27/105*    (2006.01)
*H01L 27/115*    (2006.01)
*G11C 16/04*    (2006.01)

(52) U.S. Cl.
CPC ...... *H01L 27/1052* (2013.01); *H01L 27/11521* (2013.01); *H01L 27/11524* (2013.01); *G11C 16/0483* (2013.01)

(58) Field of Classification Search
USPC .................................. 438/257–267
See application file for complete search history.

(56) References Cited

U.S. PATENT DOCUMENTS

| | | | |
|---|---|---|---|
| 5,677,873 A | 10/1997 | Choi et al. | |
| 6,567,308 B2 | 5/2003 | Yim et al. | |
| 6,576,513 B2 | 6/2003 | Yim et al. | |
| 7,888,203 B2 * | 2/2011 | Lee et al. | 438/257 |
| 8,125,015 B2 | 2/2012 | Lee et al. | |

FOREIGN PATENT DOCUMENTS

| | | |
|---|---|---|
| KR | 1999-0031224 | 5/1999 |
| KR | 10-2002-0062431 | 7/2002 |
| KR | 10-2004-0079057 | 9/2004 |

* cited by examiner

*Primary Examiner* — Samuel Gebremariam
(74) *Attorney, Agent, or Firm* — Myers Bigel Sibley & Sajovec, P.A.

(57) ABSTRACT

A nonvolatile memory device includes a string selection transistor, a plurality of memory cell transistors, and a ground selection transistor electrically connected in series to the string selection transistor and to the pluralities of memory cell transistors. First impurity layers are formed at boundaries of the channels and the source/drain regions of the memory cell transistors. The first impurity layers are doped with opposite conductivity type impurities relative to the source/drain regions of the memory cell transistors. Second impurity layers are formed at boundaries between a channel and a drain region of the string selection transistor and between a channel and a source region of the ground selection transistor. The second impurity layers are doped with the same conductivity type impurities as the first impurity layers and have a higher impurity concentration than the first impurity layers.

8 Claims, 10 Drawing Sheets

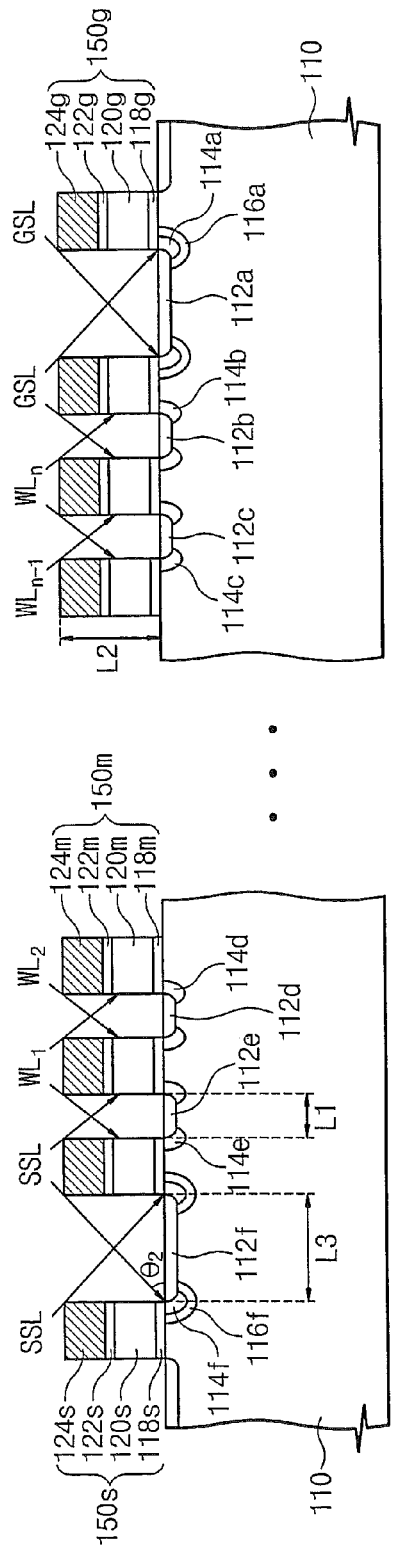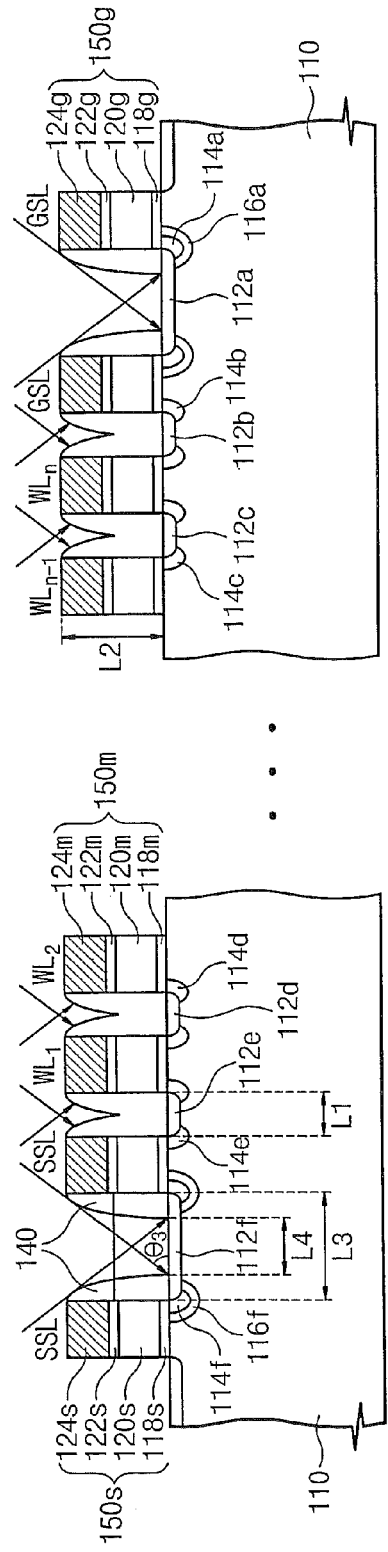

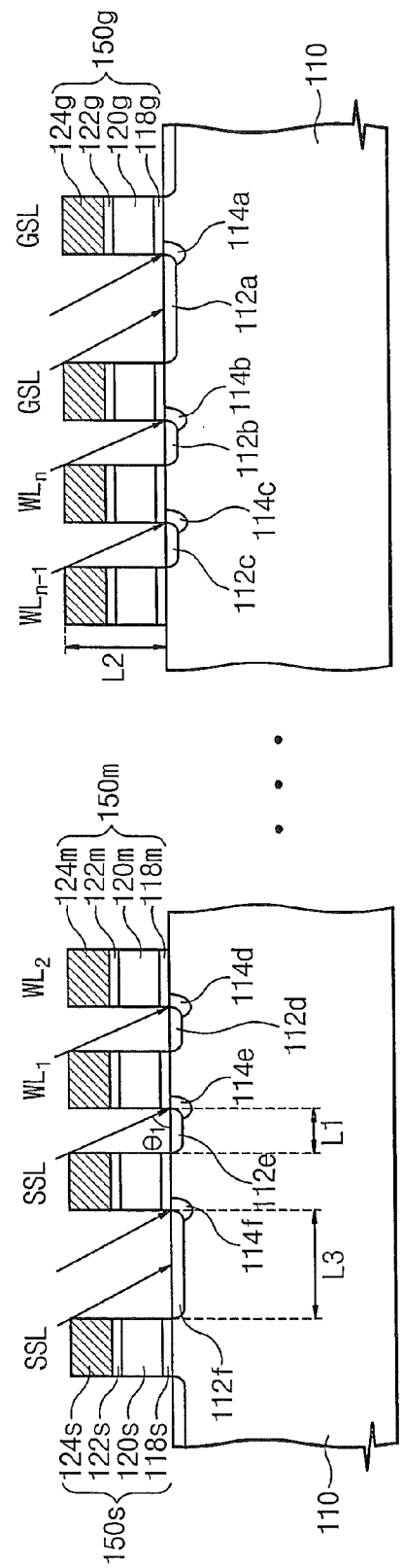

NONVOLATILE MEMORY DEVICES

CROSS-REFERENCE TO RELATED APPLICATION

This U.S. non-provisional patent application is a divisional of U.S. patent application Ser. No. 13/357,350, filed Jan. 24, 2012, which itself is a continuation of U.S. patent application Ser. No. 12/984,630, filed Jan. 5, 2011, which itself is a divisional of U.S. patent application Ser. No. 11/363,326, filed Feb. 27, 2006, which itself claims priority under 35 U.S.C. §119 to Korean Patent Application 10-2005-28117 filed on Apr. 4, 2005, the entire contents of which are hereby incorporated herein by reference.

BACKGROUND

The present invention is related to semiconductor memory devices and methods of making the same and, more particularly, to nonvolatile memory devices and methods of making the same.

Nonvolatile memory devices are capable of retaining data that is stored therein even in the absence of a supply of power. Two types of nonvolatile memory devices are NAND and NOR types. A NAND flash memory device has a memory cell string that includes a string selection transistor, pluralities of memory cell transistors, and a ground selection transistor, which are connected with each other in a series circuit. The string selection transistor is connected to a bitline and the ground selection transistor is connected to a common source line.

In programming the NAND flash memory device, 0V is applied to a selected bitline while a power source voltage of 1.8~3.3V is applied to the gate of the string selection transistor, causing a channel voltage of the selected bitline to be set to 0V. A high voltage Vpgm for programming is then applied to a selected wordline so as to carry out a programming operation by means of a Fowler-Nordheim (FN) tunneling effect. During the programming operation, erroneous programming may occur for another memory cell that shares the selected wordline with the selected memory cell but which is connected to the non-selected bitline. In an attempt to prevent such erroneous programming of the adjacent (non-selected) memory cell, an effective technique known as a self-boosting scheme may be used. One approach for inhibiting erroneous programming of a memory cell by use of a self-boosting scheme is disclosed in U.S. Pat. No. 5,677,873 entitled "METHOD OF PROGRAMMING FLASH MEMORY EEPROM INTEGRATED CIRCUIT MEMORY DEVICES TO PREVENT INADVERTENT PROGRAMMING OF NONDESIGNATED NAND MEMORY CELLS THEREIN".

A self-boosting scheme can include applying 0V to the gate of the ground selection transistor so as to interrupt a current path toward a ground voltage. The power source voltage Vcc is used as a program-inhibiting voltage which is applied to a deselected bitline and the gate of the string selection transistor. Thus, the source of the string selection transistor connected to the deselected bitline is charged up to the level of Vcc−Vth, where Vth denotes a threshold voltage of the string selection transistor. As a result, the string selection transistor is substantially biased in a shut-off state. Then, the selected wordline is supplied a high voltage Vpgm for programming while deselected wordlines are supplied a pass voltage Vpass, which causes a channel voltage of a cell transistor that is not selected for programming is boosted higher. Accordingly, it may be possible to prevent/inhibit programming of deselected memory cells. However, this process may also cause an unacceptable level of leakage current to be generated in a high-density NAND flash memory device.

For example, with reference to FIG. 1, when a voltage of 0V is applied to a source region 13 and to a gate electrode of the ground selection transistor connected to a deselected bitline, a voltage of a drain region 13' is increased by a boosting action of a channel voltage. Thus, depletion regions 15 around the source and drain regions 13 and 13' may connect with each other to cause a punch-through effect by which a channel current therethrough becomes uncontrollable. The boosted channel voltage may also cause a drain-induced barrier lowering (DIBL) effect. The punch-through and DIBL effects may readily generate leak currents therein, and may complicate the process to inhibit erroneous programming. Such "soft programming" problems can occur more often as length of the gate electrode becomes shorter (short-channel effects). The continuing trend toward higher integration density for memory devices can therefore lead to greater soft programming problems.

SUMMARY OF THE INVENTION

In accordance with some embodiments of the present invention, a nonvolatile memory device includes a string selection transistor, a plurality of memory cell transistors, and a ground selection transistor electrically connected in series to the string selection transistor and to the pluralities of memory cell transistors. Each of the transistors includes a channel region and source/drain regions. First impurity layers are formed at boundaries of the channels and the source/drain regions of the memory cell transistors. The first impurity layers are doped with opposite conductivity type impurities relative to the source/drain regions of the memory cell transistors. Second impurity layers are formed at boundaries between a channel and a drain region of the string selection transistor and between a channel and a source region of the ground selection transistor. The second impurity layers are doped with the same conductivity type impurities as the first impurity layers and have a higher impurity concentration than the first impurity layers.

The second impurity layers having the higher impurity concentration can function to inhibit/prevent leakage current through the associated regions of the string and ground selection transistors, and may thereby avoid malfunction of the memory device during a programming operation.

In accordance with some other embodiments of the present invention, a nonvolatile memory device includes a string selection transistor, a plurality of memory cell transistors, and a ground selection transistor electrically connected in series to the string selection transistor and to the pluralities of memory cell transistors. Each of the transistors includes a channel region and source/drain regions. First impurity layers are formed at boundaries between a channel and a drain region of the string selection transistor and between a channel and a source region of the ground selection transistor. The first impurity layers are doped with opposite conductivity type impurities relative to the source/drain regions of the string selection transistor and of the ground selection transistor. The second impurity layers are formed at boundaries between the channel and the source region of the string selection transistor and between the channel and the drain region of the ground selection transistor. The second impurity layers are doped with the same conductivity type impurities as the first impurity layers and have a lower impurity concentration than the first impurity layers.

In accordance with some other embodiments of the present invention, a nonvolatile memory device includes a string selection transistor, a plurality of memory cell transistors, and a ground selection transistor electrically connected in series to the string selection transistor and to the pluralities of memory cell transistors. Each of the transistors includes a channel region and source/drain regions. First impurity layers are formed at boundaries of the channels and the source/drain regions of the string selection transistor, the memory cell transistors, and the ground selection transistor. The first impurity layers are doped with opposite conductivity type impurities relative to the source/drain regions of the string selection transistor, the memory cell transistors, and the ground selection transistor. The first impurity layers are absent from (not formed in) a drain region of a first one of the memory cell transistors that is closest to the string selection transistor or are absent from (not formed in) a source region of a second one of the memory cell transistors that is closest to the ground selection transistor. This may inhibit soft programming effects of the memory cell transistors closest to the string and ground selection transistors due to hot carriers generated by differences between boosting voltages and voltages applied to gates electrodes of the string and ground selection transistors.

In accordance with some other embodiments of the present invention, a nonvolatile memory device includes a string selection transistor, a plurality of memory cell transistors, and a ground selection transistor electrically connected in series to the string selection transistor and to the pluralities of memory cell transistors. Each of the transistors includes a channel region and source/drain regions. First impurity layers are formed at boundaries of the channels and the source/drain regions of the string selection transistor, the memory cell transistors, and the ground selection transistor. The first impurity layers are doped with opposite conductivity type impurities relative to the source/drain regions of the string selection transistor, the memory cell transistors, and the ground selection transistor. The first impurity layers are alternatively formed in the source and drain regions of the transistors.

In accordance with some other embodiments of the present invention, a method of making a nonvolatile memory device includes forming a string selection transistor, a plurality of memory cell transistors, and a ground selection transistor where each has a channel region and source/drain regions in a substrate. First impurity ions are injected into the substrate to form first impurity layers at boundaries of the channels and the source/drain regions of the string selection transistor, the memory cell transistors, and the ground selection transistor, the first impurity layers having an opposite conductivity relative to the source/drain regions of the string selection transistor, the memory cell transistors, and the ground selection transistor. Second impurity ions, which are same conductivity type as the first impurity ions, are injected into the boundaries between the channel and drain regions of the string selection transistor and between the channel and source regions of the ground selection transistor.

In some further embodiments, injection of the second impurity ions includes forming an ion implantation mask on the substrate that exposes portions of the drain region of the string selection transistor and the source region of the ground selection transistor, and injecting the second impurity ions into the exposed portions of the drain region of the string selection transistor and the source region of the ground selection transistor.

In some further embodiments, an interval between the memory cell transistors is L1, a height of the memory cell transistors from the substrate is L2, and the first and second impurity ions are injected at an incident angle θ1 defined by θ1≥tan−1(L2/L1). The second impurity ions can be injected at a smaller incident angle than the first impurity ions. Injection of the second impurity ions can include forming spacers on sidewalls of the string selection transistor, the plural memory cell transistors, and the ground selection transistor, and injecting the second impurity ions into the substrate to form second impurity layers at the boundaries between the channel and drain regions of the string selection transistor and between the channel and source regions of the ground selection transistor.

In accordance with some other embodiments of the present invention, a method of making a nonvolatile memory device includes forming a string selection transistor, a plurality of memory cell transistors, and a ground selection transistor where each has a channel region and source/drain regions in a substrate. Impurity layers are formed at boundaries of the channels and the source/drain regions of the string selection transistor, the memory cell transistors, and the ground selection transistor, except the impurity layers are not formed at the drain region of a first one of memory cell transistors that is closest to the string selection transistor and at the source region of a second one of the memory cell transistors that is closest to the ground selection transistor.

In accordance with some other embodiments of the present invention, a method of making a nonvolatile memory device includes forming a string selection transistor, a plurality of memory cell transistors, and a ground selection transistor where each has a channel region and source/drain regions in a substrate. First impurity ions are injected into boundaries of the channels and the source regions of the string selection transistor, the memory cell transistors, and the ground selection transistor. The first impurity layers are doped with opposite conductivity type impurities relative to the source regions of the string selection transistor, the memory cell transistors, and the ground selection transistor.

BRIEF DESCRIPTION OF THE FIGURES

The accompanying drawings are included to provide a further understanding of the invention, and are incorporated in and constitute a part of this specification. The drawings illustrate example embodiments of the invention and, together with the description, serve to explain principles of the present invention. In the drawings:

FIGS. 4 and 5 are cross-sectional views taken along the line A-A' of FIG. 2, illustrating an exemplary modification to the first embodiment of the present invention;

FIG. 8 is a cross-sectional view taken along the line A-A' of FIG. 2, illustrating a third embodiment of the present invention.

DETAILED DESCRIPTION OF EMBODIMENTS

Figure 1:
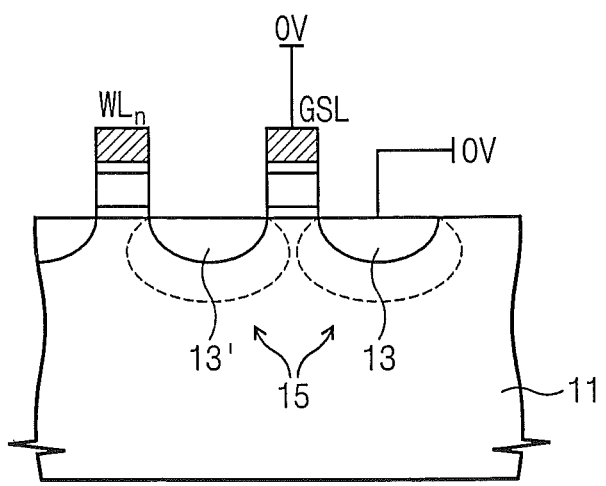
FIG. 1 illustrates generation of leakage current in a conventional NAND flash memory device.

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art.

In the drawings, the size and relative sizes of layers and regions may be exaggerated for clarity. Like numbers refer to like elements throughout.

It will be understood that when an element or layer (or film) is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region or etched region illustrated as a rectangle will, typically, have rounded or curved features and/or a gradient of implant concentration at its edges rather than a binary change from implanted to non-implanted region or etched to non-etched region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention are now described below in conjunction with the accompanying drawings.

Figure 2:
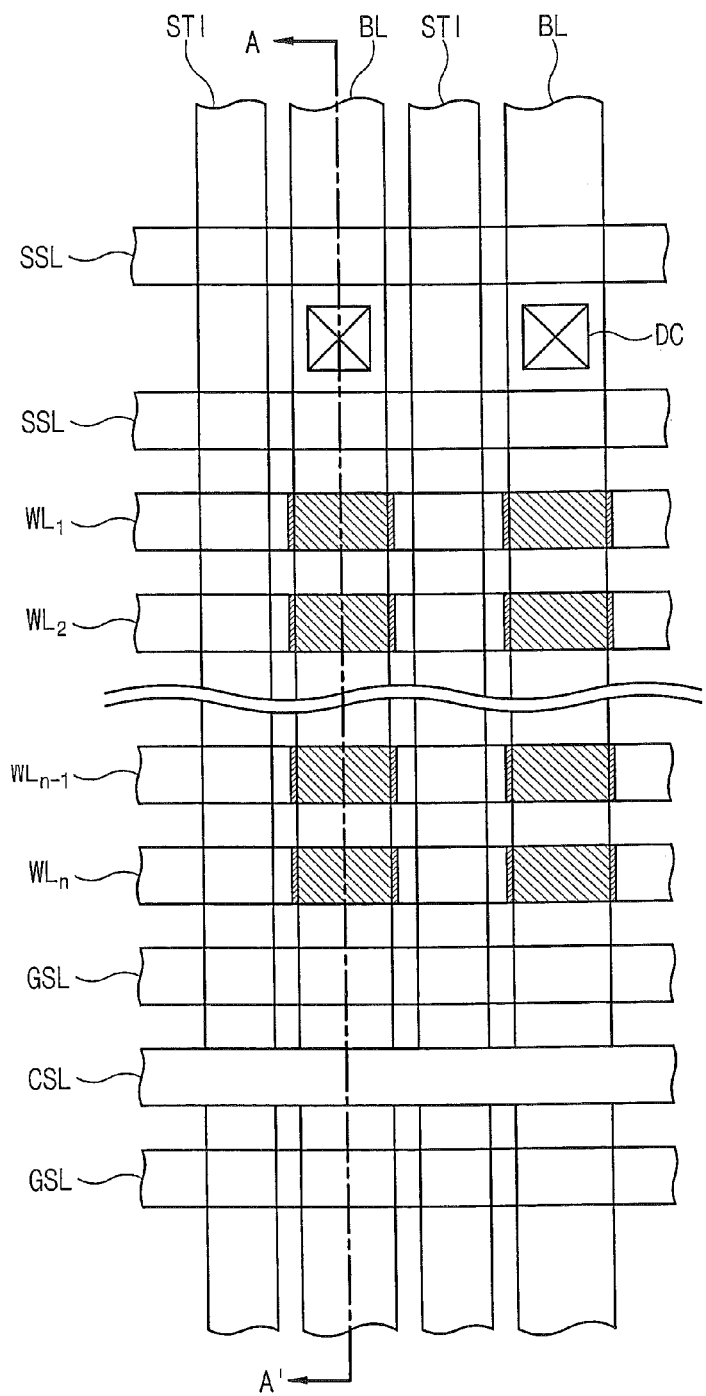
FIG. 2 is a plan view of a cell string of a NAND flash memory device in accordance with embodiments of the present invention.

FIG. 2 illustrates a plan view of a unit cell string in a NAND flash memory device according to embodiments of the present invention.

Referring to FIG. 2, field isolation films, which may be shallow-trench isolation (STI) regions, are disposed to define active regions within predetermined regions in a substrate. A string selection line SSL, a plurality of wordlines WL1~WLn, and a ground selection line GSL are configured to cross the active regions in a sequence. Bitline contact plugs DC are formed between the string selection line SSL and another adjacent string selection line SSL, and electrically connecting a bitline BL with a cell string. Common source lines CSL are formed between the ground selection line GSL and another adjacent ground selection line GSL.

In the NAND flash memory device, the unit cell string includes a string selection transistor with a gate electrode which is the string selection line SSL, a plurality of memory cell transistors with gate electrodes which are the plural wordlines WL, and a ground selection transistor with a gate electrode which is the ground selection line GSL. According to some embodiments of the present invention, the device may be configured to prevent/substantially inhibit leakage currents in impurity layers at boundaries among channels and source/drain regions of the string selection transistor, the plural memory cell transistors, and the ground selection transistor. Further embodiments will now be described with reference to cross-sectional views taken along the line A-A' of the plan view of FIG. 2.

Figure 3A:
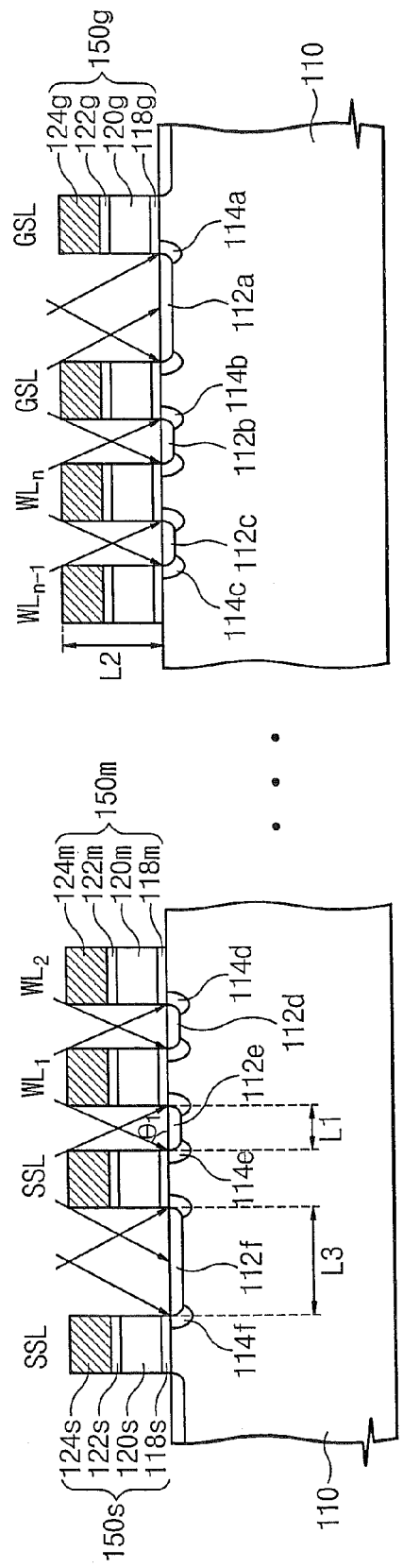
FIGS. 3A and 3B are cross-sectional views taken along the line A-A' of FIG. 2, illustrating a first embodiment of the present invention.
Figure 3B:
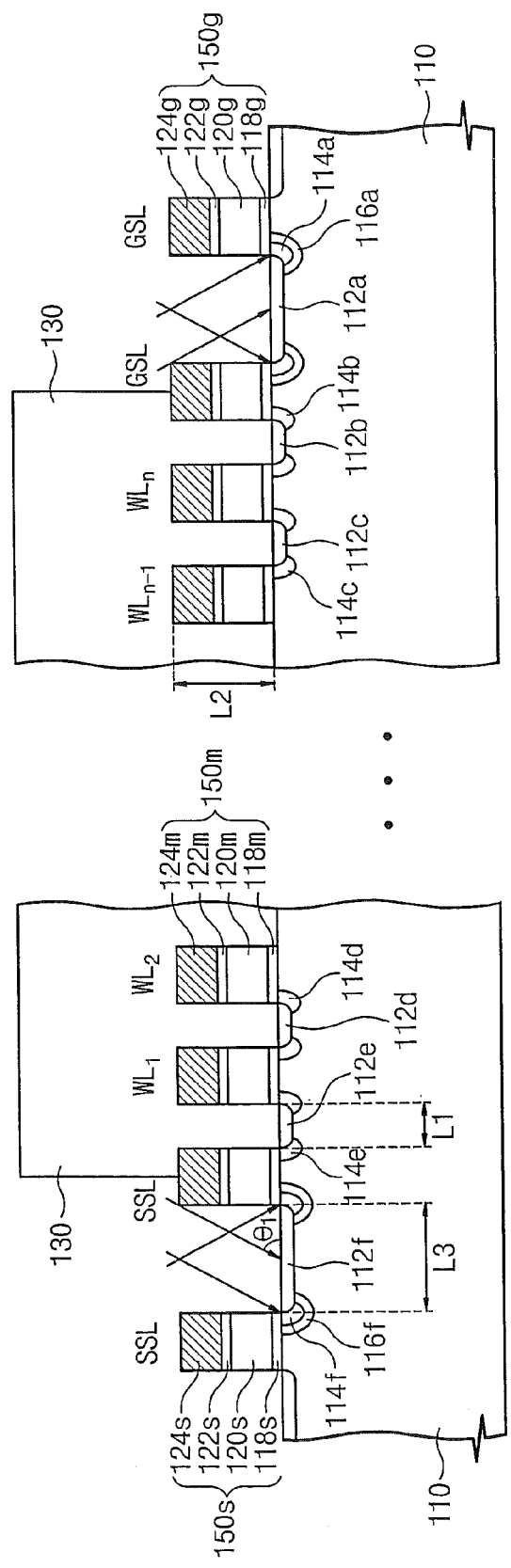

FIGS. 3A and 3B are cross-sectional views taken along the line A-A' of FIG. 2, and illustrate a first embodiment of the present invention. In FIG. 3, the reference L1 denotes an interval between adjacent memory cell transistors, the reference L2 denotes a height of each transistor from the substrate, and the reference L3 denotes an interval between adjacent string selection transistors or an interval between adjacent ground selection transistors.

Referring to FIG. 3A, gate electrodes of the string selection transistor, the plural memory cell transistors, and the ground selection transistors, 150s, 150m, and 150g, respectively, are formed over the active regions of the substrate 110. Each of the gate electrodes 150m of the memory cell transistors includes a stacked structure of a tunneling insulation film 118m, a first conductive film 120m, a dielectric film 122m, and a second conductive film 124m on the substrate 110. The gate electrodes of the string and ground selection transistors, 150s and 150g, respectively, may be also formed with the stacked structure of the films as like the gate electrodes of the plural memory cell transistors. But, it may be preferable for the gate electrodes of the string and ground selection transistors, 150s and 150g, to be formed with a structure that excludes first conductive films 120s and 120g or second conductive films 124s and 124g, or with a structure that electrically connects the first conductive films 120s and 120g with the second conductive films 124s and 124g.

In the memory device of FIGS. 2-3B, the first conductive film functions as a charge storage layer while the second conductive film functions as a gate electrode. The charge storage layer may be formed of a silicon nitride ($Si_3N_4$) film, a nano-crystalline silicon film, a nano-crystalline silicon germanium film, a nano-crystalline metal film, a nano-crystalline germanium film, tantalum oxide (TaO, $Ta_2O_5$), an aluminum oxide ($Al_2O_3$) film, a hafnium oxide ($HfO_2$) film, a hafnium alumina (HfAlO) film, a hafnium silicon oxy-nitride (HfSiON) film, or a composite of more than of one thereof.

Impurity ions are then injected into the substrate 110 so as to form source/drain regions 112a~112f. The source/drain regions 112a~112f may be formed by way of ion implantation, in-situ epitaxial growth, and/or diffusion. The source/drain regions 112a~112f may be formed after forming impurity layers through a subsequent processing step so as to prevent/avoid leakage currents therein.

Next, an ion implantation process is carried out to form first impurity layers 114a~114f around boundaries between the source/drain regions and channels of the string selection transistor, the plural memory cell transistors, and the ground selection transistor. During this, it may be preferable for the first impurity layers 114a~114f to have a different conductivity from that of the source/drain regions. For example, if the source/drain regions 112a~112f are formed by injecting N-type impurities, the impurity layers 114a~114f may be completed by injecting P-type impurities such as boron (B) or boron fluoride ($BF_2$). The first impurity layers 114a~114f may be formed with a high concentration, such as with an impurity concentration of 1E12 through 3E13 ion/$cm^2$. An ion injection angle (i.e., ion injection angle) of the impurity ions to the substrate, $\theta1$, may preferably be larger than or equal to $\tan^{-1}(L2/L1)$.

As a result of the ion implantation process, the first impurity layers 114a~114f may be formed at the boundary between the channel and drain region 112f of the string selection transistor, at the boundaries between the channels and source/drain regions 112b~112e of the plural memory cell transistors, and/or at the boundary between the channel and drain region 112a of the ground selection transistor.

Referring to FIG. 3B, after masking the top sides of the plural memory cell transistors by a photoresist pattern 130, an ion implantation process is carried out to form second impurity layers 116a and 116f using what can be the same incident angle for impurity implantation as that used to form the first impurity layers 114a~114f. Because of the positioning of the photoresist pattern 130, the second impurity layers 116a and 116f are also formed just at the boundaries between the channel and the drain region 112f of the string selection transistor and between the channel and the source region 112a of the ground selection transistor. The regions to which the second impurity layers 116a and 116f are additionally provided are configured with a higher impurity concentration relative to the regions of the first impurity layers 114a~114f. Accordingly, the second impurity layers 116a and 116f provided around the drain region 112f of the string selection transistor and the source region 112a of the ground selection transistor may further inhibit generation of leakage current therein which may otherwise occur from potentially large voltage differences between boosting voltages and voltages applied to the gate electrodes 150s and 150g while a program-inhibiting voltage is supplied.

FIGS. 4 and 5 are cross-sectional views taken along the line A-A' of FIG. 2, illustrating modifications of the first embodiment of the present invention. FIGS. 4 and 5 further illustrate formation of the second impurity layers without the photoresist pattern, such as shown in FIG. 3B.

Referring to FIG. 4, the impurity ions for the second impurity layers 116a and 116f are injected with another incident angle $\theta2$, which is $\tan^{-1}(L2/L3)$, to the substrate 110. The incident angle $\theta2$ of the impurities to the substrate 110 may be larger than the value of $\tan^{-1}(L2/L3)$. As shown in the figures, because the interval between the memory cell transistors is narrower than that of adjacent string selection transistors or adjacent ground selection transistors, the impurity ions may not be injected into the substrate because they are blocked by the gate electrodes 150m between the memory cell transistors. Thus, because the ion implantation is effectively carried out only at the boundaries between the channel and the drain region 112f of the string selection transistor and between the channel and the source region 112a of the ground selection transistor, the second impurity layers 116a and 116f are effectively defined at those boundaries.

Referring to FIG. 5, spacers 140 are then formed on sidewalls of the gate electrode 150s of the string selection transistor, the gate electrodes 150m of the plural memory cell transistors, and the gate electrode 150g of the ground selection transistor. The spacers 140 may be formed by etching a silicon nitride film that has been deposited entirely over the substrate where the gate electrodes are arranged.

Assuming that L4 has a length defined by subtracting widths of the spacers 140 from the L3 interval between the adjacent string selection transistors 150s or between the adjacent ground selection transistors 150g, the ion implantation may be carried out with another ion injection angle $\theta3$, i.e., $\tan-1(L2/L4)$, of impurity ions into the substrate 110. As shown in the figures, because it can be difficult for the ion impurities to reach source/drain regions 112b~112e of the memory cell transistors 150m, the second impurity layers 116a and 116f may be formed only at the boundaries between the channel and the drain region 112f of the string selection transistor 150s and between the channel and the source region 112a of the ground selection transistor 150g.

Figure 6A:
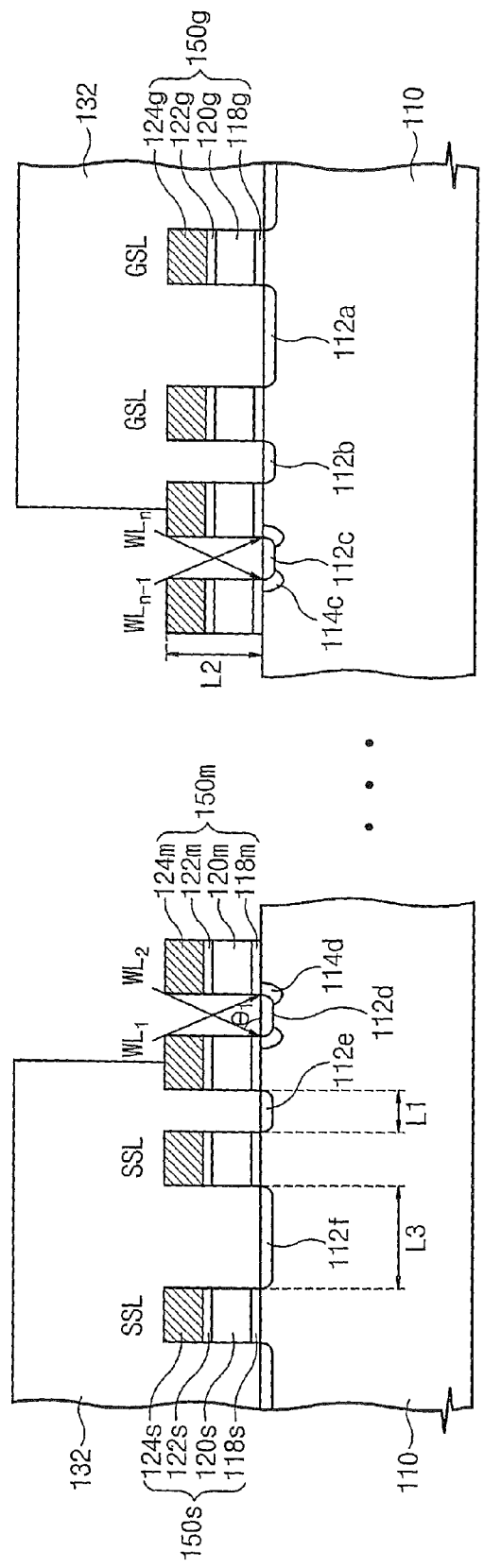
FIGS. 6A and 6B are cross-sectional views taken along the line A-A' of FIG. 2, illustrating a second embodiment of the present invention.
Figure 6B:
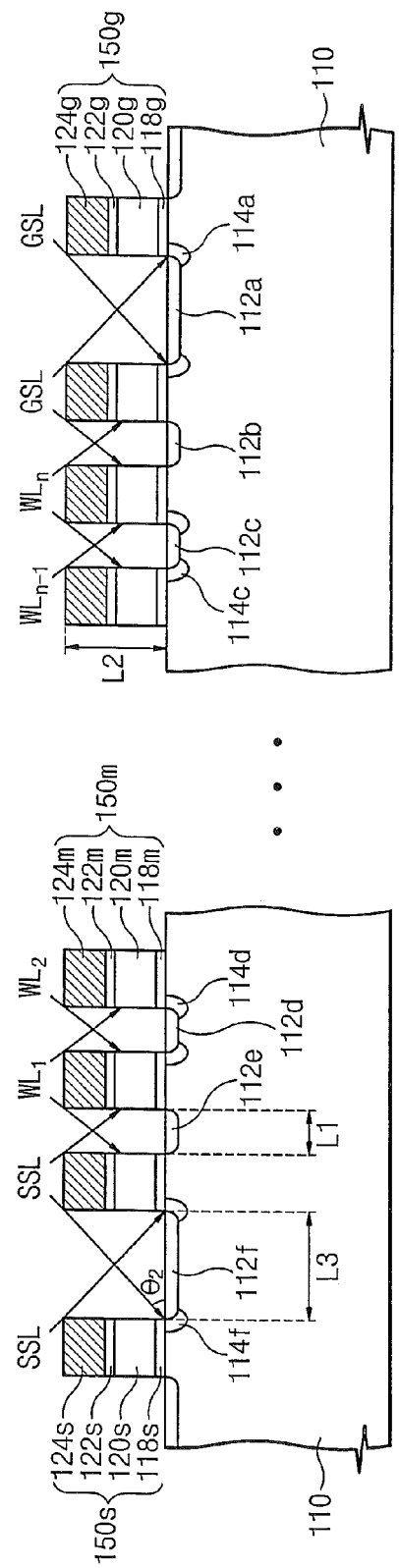

FIGS. 6A and 6B are cross-sectional views taken along the line A-A' of FIG. 2, illustrating a second embodiment of the present invention.

Referring to FIG. 6A, a photoresist pattern 132 is formed that is aligned over the string selection transistor 150s, the ground selection transistor 150g, and the memory cell transistors 150m adjacent to the selection transistors. Ion implantation is then carried out with the incident angle $\theta1=\tan^{-1}(L2/L1)$ so as to form first impurity layers 114c and 114d. The first impurity layers are not formed at the source region 112b of the memory cell transistor closest to the ground selection transistor 150g or at the drain region 112e of the memory cell transistor closest to the string selection transistor 150s. In other words, the impurity layers 114c and 114d can be formed just at or around boundaries among the channels and the source/drain regions 112c and 112d of the memory cell transistors, except at the drain region 112e of the memory cell transistor closest to the string selection transistor 150s or the source region 112b of the memory cell transistor closest to the ground selection transistor 150g.

By not forming the first impurity layers at the boundaries among the channels and source/drain regions of the memory cell transistors closest to the string and ground selection transistors 150s and 150g, injection of hot carriers therein may be prevented/inhibited. For example, hot carriers may be generated due to a difference between a voltage applied to the string selection transistor 150s or the ground selection transistor 150g and a boosted voltage thereof while carrying out a process to inhibit erroneous programming of non-selected transistors. If the first impurity layers were formed therein, electric fields at those junctions may be increased which may cause sufficient hot carriers to be injected thereto so as to cause a soft programming of the memory cell transistor closest to the string or ground transistor 150s,150g. To prevent/avoid such soft programming, the first impurity layers are not formed at the boundaries between the channels and the source/drain regions 112b and 112e of the memory cell transistors closest to each to the ground and string selection transistors 150s, 150g.

With reference now to FIG. 6B, ion implantation is carried out with an incident angle $\theta 2$ that is $\tan^{-1}(L3/L2)$, which may preferably be smaller than that used when forming the first impurity layers 114c and 114d, and so that the first impurity layers 114a and 114f are then formed at the boundaries between the channel and the drain region 112f of the string selection transistor 150s and between the channel and the source region 112a of the ground selection transistor 150g. The methods described with regard to FIGS. 3B and 5 may be substituted for those described for FIG. 4 and, accordingly, other associated modifications to the process may be carried out to form the first impurity layers 114a and 114f.

Figure 7A:
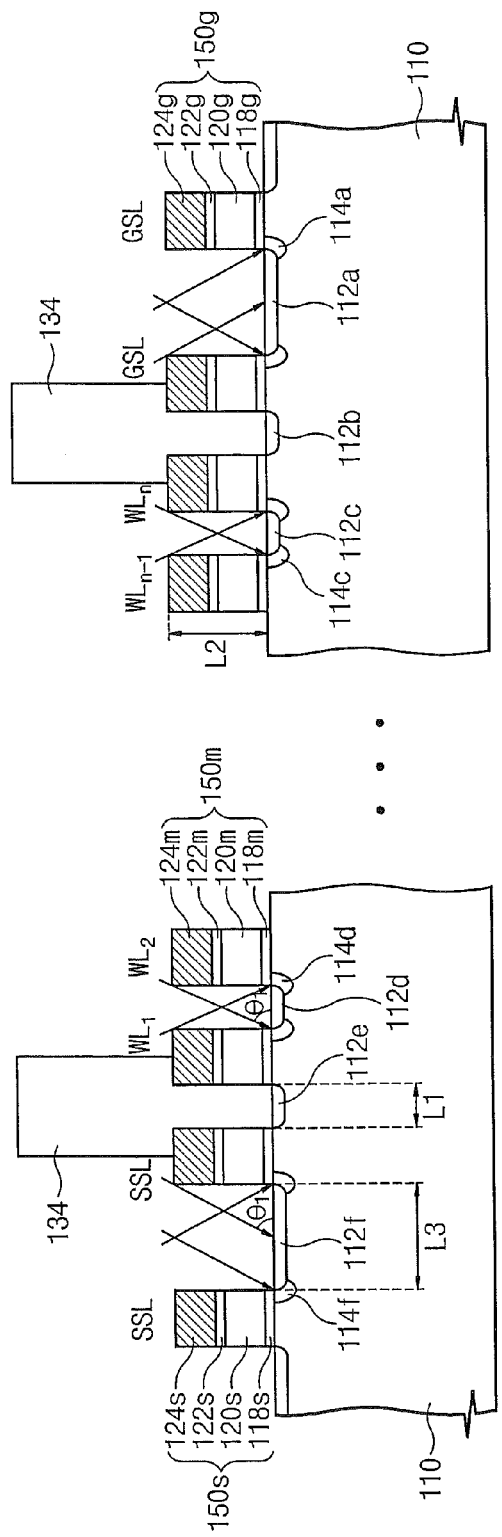
FIG. 7A is a cross-sectional view taken along the line A-A' of FIG. 2, illustrating an exemplary modification to the second embodiment according to the present invention.

FIG. 7A is a cross-sectional view taken along the line A-A' of FIG. 2, illustrating some modifications to the second embodiment of the present invention. In particular, FIG. 7A illustrates a process for forming the first impurity layers through a one-step ion implantation process, which may be carried out without using at least some of the processing steps described with reference to FIGS. 6A and 6B.

Referring to FIG. 7A, a photoresist pattern 134 is formed that is aligned over the source/drain region 112e of the memory cell transistors 150m closest to the string selection transistor 150s and over the source/drain region 112b of the memory cell transistors 150m closest to the ground selection transistor 150g. Ion implantation is then carried out in the first impurity layers 114a, 114c, 114d, and 114f. During the ion implantation it may be preferable to set the incident angle of the impurity ions at $\theta 1=\tan^{-1}(L2/L1)$ relative to the substrate 110.

Figure 7B:
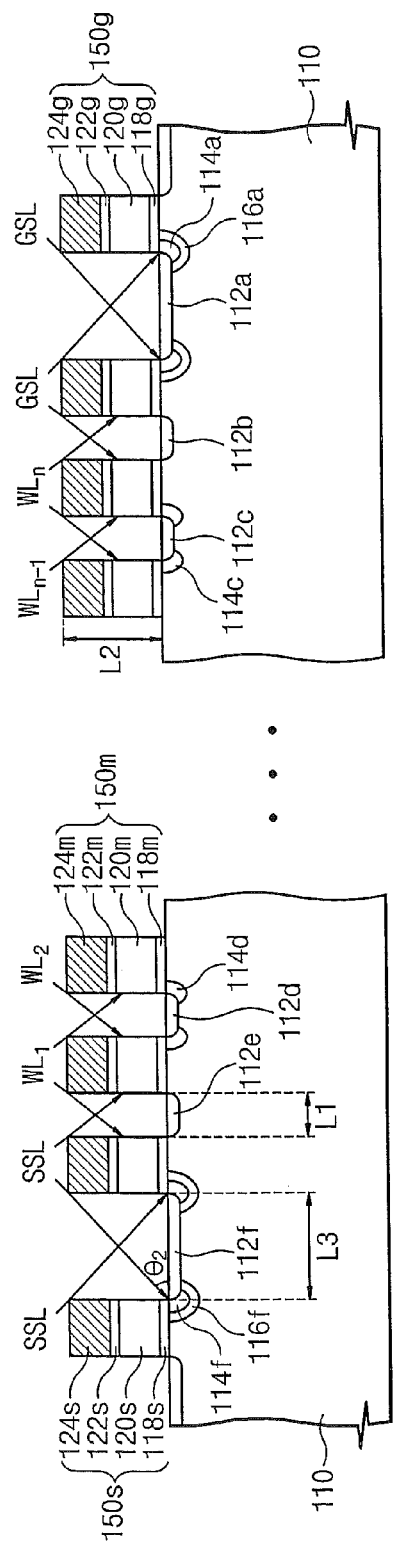
FIG. 7B is a cross-sectional view taken along the line A-A' of FIG. 2, illustrating another exemplary modification to the second embodiment according to the present invention.

FIG. 7B is a cross-sectional view taken along the line A-A' of FIG. 2, illustrating another modification to the second embodiment of the present invention.

Referring to FIG. 7B, after the first impurity layers 114a, 114c, 114d, and 114f are formed, the second impurity layers 116a and 116f are then formed through ion implantation at the boundaries between the channel and the drain region 112f of the string selection transistor 150s and between the channel and the source region 112a of the ground selection transistor 150g. It may be preferable to set the incident angle of the impurity ions at $\theta 2=\tan^{-1}(L2/L3)$ relative to the substrate 110. The processing steps described above with reference to FIGS. 3B and 5 may be carried out to form the second impurity layers at the boundaries between the channel and drain region of the string selection transistor 150s and between the channel and source region of the ground selection transistor 150g.

FIG. 8 is a cross-sectional view taken along the line A-A' of FIG. 2, illustrating a third embodiment of the present invention.

Referring to FIG. 8, the first impurity layers may be formed by injecting impurity ions into the boundaries between the channels and the source/drain regions of the string selection transistor 150s, the plural memory cell transistors 150m, and the ground selection transistor 150g. Each of the first impurity layers is formed at one of the source and drain regions in each transistor. It may be preferable to set the incident angle of the impurity ions at $\theta 1=\tan^{-1}(L2/L1)$ relative to the substrate 110. The incident angle $\theta 1$ may be larger than the value of $\tan^{-1}(L2/L1)$. As such, if the ion implantation is conducted unilaterally, and the first impurity layers may be asymmetrically formed throughout the source and drain regions.

As explained above, soft programming of a non-selected memory cell transistor via hot carriers may occur most often in the memory cell transistor closest to the ground selection transistor compared to the memory cell transistor closest to the string selection transistor. When supplying the program-inhibiting voltage, the power supply voltage is applied to the gate electrode of the string selection transistor while 0V is applied to the gate electrode of the ground selection transistor and, thereby, the difference between the gate voltage and a boosting voltage is larger in the ground selection transistor than in the string selection transistor. Thus, soft programming may be more easily induced into the memory cell transistor that is closest to the ground selection transistor. However, by using ion implantation as described above it may be possible to prevent such soft programming due to hot carrier injection.

By way of the processing steps as shown in FIGS. 3B, 4, and 5, the second impurity layers are additionally formed at the boundaries between the channel and drain of the string selection transistor and between the channel and source of the ground selection transistor.

As described above, leakage currents may be prevented by forming the first impurity layers, which are different from the source/drain regions in conductivity, at boundaries among the channels and source/drain regions of the transistors. In addition, the second impurity layers are further formed at the drain region of the string selection transistor and the source region of the ground selection transistor, which may more effectively inhibit the leakage currents therein.

Moreover, in accordance with some embodiments, without the impurity layers around the source region of the string selection transistor and the drain region of the ground selection transistor, it may be possible to prevent/inhibit hot carriers from flowing into memory cell transistors adjacent to the string and ground selection transistors and thereby avoiding the above-described software programming. Because leakage currents are inhibited, the device may substantially operate without errors when programming a selected memory cell. The sizes of the string and ground selection transistors may thereby be reduced, which may allow fabrication of higher-density nonvolatile memory devices.

While the present invention has been described in connection with the embodiments of the present invention illustrated in the accompanying drawings, it is not limited thereto. It will be apparent to those skilled in the art that various substitution, modifications and changes may be thereto without departing from the scope and spirit of the invention.

What is claimed is:

1. A method of making a nonvolatile memory device, the method comprising:
   forming a string selection transistor, a plurality of memory cell transistors, and a ground selection transistor where each has a channel region and source/drain regions in a substrate;
   selectively injecting first p conductivity type impurity ions into the substrate to form first impurity layers at boundaries between the channel region and the source/drain regions of the string selection transistor, at boundaries between the channel regions and the source/drain regions of the memory cell transistors, and at boundaries between the channel region and the source/drain regions of the ground selection transistor; and
   selectively injecting second p conductivity type impurity ion into the boundary between the channel region and the drain region of the string selection transistor and into the boundary between the channel region and the source region of the ground selection transistor.

2. The method of claim 1, wherein injecting second p conductivity type impurity ions comprises:
   forming an ion implantation mask on the substrate that exposes portions of the drain region of the string selection transistor and the source region of the ground selection transistor; and
   injecting the second p conductivity type impurity ions into the exposed portions of the drain region of the string selection transistor and the source region of the ground selection transistor.

3. The method of claim 2, wherein:
   an interval between the memory cell transistors is L1;
   a height of the memory cell transistors from the substrate is L2; and
   the first and second p conductivity type impurity ions are injected at an incident angle θ1 defined by θ1≥tan−1(L2/L1).

4. The method of claim 1,
   wherein the second p conductivity type impurity ions are injected at a smaller incident angle than the first p conductivity type impurity ions.

5. The method of claim 1, wherein injecting second p conductivity type impurity ions comprises:
   forming spacers on sidewalls of the string selection transistor, the memory cell transistors, and the ground selection transistor; and
   injecting the second p conductivity type impurity ions into the substrate with an incident angle so that the second p conductivity type impurity ions reach the boundary between the channel region and the drain region of the string selection transistor and the boundary between the channel region and the source region of the ground selection transistor.

6. A method of making a nonvolatile memory device, the method comprising:
   forming a string selection transistor, a plurality of memory cell transistors, and a ground selection transistor where each has a channel region and source/drain regions in a substrate; and
   selectively forming impurity layers comprising p conductivity type impurity ions at a boundary between the channel region and the drain region of the string selection transistor, at a boundary between the channel region and the source region of the ground selection transistor and at boundaries between the channel regions and the source/drain regions of the memory cell transistors except at the boundary between the channel region and the drain region of a first one of the memory cell transistors that is closest to the string selection transistor and except at the boundary between the channel region and the source region of a second one of the memory cell transistors that is closest to the ground selection transistor.

7. The method of claim 6, wherein forming the impurity layers comprises:
   forming an ion implantation mask on the substrate, wherein the ion implantation mask exposes the drain region of the string selection transistor, the source/drain regions of the memory cell transistors except the drain region of the first one of the memory cell transistors that is closest to the string selection transistor and except the source region of the second one of the memory cell transistors that is closest to the ground selection transistor, and the source region of the ground selection transistor, and the ion implantation mask covers the drain region of the first one of the memory cell transistors and the source region of the second one of the memory cell transistors; and
   injecting the p conductivity type impurity ions into the exposed boundaries between the channel regions and the source/drain regions of the string selection transistor, the memory cell transistors, and the ground selection transistor.

8. The method of claim 7, wherein the p conductivity type impurity ions comprises first p conductivity type impurity ions, and
   the method further comprises
   injecting second p conductivity type impurity ions into the exposed boundary between the channel region and the drain region of the string selection transistor and into the exposed boundary between the channel region and the source region of the ground selection transistor.

* * * * *